United States Patent
Kinoshita et al.

(10) Patent No.: US 9,207,529 B2
(45) Date of Patent: Dec. 8, 2015

(54) REFLECTIVE MASK BLANK FOR EUV LITHOGRAPHY, AND PROCESS FOR ITS PRODUCTION

(71) Applicant: Asahi Glass Company, Limited, Chiyoda-ku (JP)

(72) Inventors: Takeru Kinoshita, Chiyoda-ku (JP); Masaki Mikami, Chiyoda-ku (JP); Kazuyuki Hayashi, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 182 days.

(21) Appl. No.: 14/134,433

(22) Filed: Dec. 19, 2013

(65) Prior Publication Data
US 2014/0186752 A1 Jul. 3, 2014

(30) Foreign Application Priority Data
Dec. 27, 2012 (JP) ................. 2012-284649

(51) Int. Cl.
*G03F 1/24* (2012.01)
*G03F 1/22* (2012.01)
*G03F 1/48* (2012.01)

(52) U.S. Cl.
CPC ... *G03F 1/24* (2013.01); *G03F 1/48* (2013.01)

(58) Field of Classification Search
CPC ..................................... G03F 1/24; G03F 1/22
See application file for complete search history.

(56) References Cited

U.S. PATENT DOCUMENTS

| | | | |
|---|---|---|---|
| 5,196,283 A | 3/1993 | Ikeda et al. | |
| 5,754,619 A | 5/1998 | Yoshihara et al. | |
| 8,105,735 B2 | 1/2012 | Kinoshita | |
| 2005/0208389 A1 | 9/2005 | Ishibashi et al. | |
| 2009/0042110 A1* | 2/2009 | Matsuo et al. | 430/5 |
| 2010/0304283 A1 | 12/2010 | Hayashi et al. | |
| 2011/0266140 A1 | 11/2011 | Kinoshita et al. | |
| 2012/0196208 A1 | 8/2012 | Mikami et al. | |

(Continued)

FOREIGN PATENT DOCUMENTS

| JP | 3-16116 | 1/1991 |
|---|---|---|
| JP | 2642724 | 8/1997 |

(Continued)

OTHER PUBLICATIONS

U.S. Appl. No. 14/182,688, filed Feb. 18, 2014, Kinoshita.

(Continued)

*Primary Examiner* — Stephen Rosasco
(74) *Attorney, Agent, or Firm* — Oblon, McClelland, Maier & Neustadt, L.L.P.

(57) ABSTRACT

A process for producing a reflective mask blank for EUV lithography (EUVL), which comprises forming a multilayer reflective film for reflecting EUV light on a film-forming surface of a substrate, then forming a protective layer for protecting the multilayer reflective film, on the multilayer reflective film, and forming an absorber layer for absorbing EUV light, on the protective layer, to produce a reflective mask blank for EUVL, wherein the multilayer reflective film is a Mo/Si multilayer reflective film, the protective layer is a Ru layer or a Ru compound layer, the absorber layer is a layer containing at least Ta and N, and after forming the Mo/Si multilayer reflective film, the protective layer is formed, and after forming a Si thin film or Si oxide thin film having a thickness of at most 2 nm on the protective layer, the absorber layer is formed.

22 Claims, 3 Drawing Sheets

(56) References Cited

U.S. PATENT DOCUMENTS

| | | |
|---|---|---|
| 2012/0231378 A1 | 9/2012 | Mikami et al. |
| 2013/0115547 A1 | 5/2013 | Mikami et al. |

FOREIGN PATENT DOCUMENTS

| | | |
|---|---|---|
| JP | 2877190 | 3/1999 |
| JP | 3077393 | 8/2000 |
| JP | 2004-6789 | 1/2004 |
| JP | 2004-6799 | 1/2004 |
| WO | WO 2009/116348 A1 | 9/2009 |
| WO | WO 2011/071123 A1 | 6/2011 |

OTHER PUBLICATIONS

U.S. Appl. No. 14/288,908, filed May 28, 2014, Hayashi.

* cited by examiner

REFLECTIVE MASK BLANK FOR EUV LITHOGRAPHY, AND PROCESS FOR ITS PRODUCTION

BACKGROUND OF INVENTION

1. Field of Invention

The present invention relates to a reflective mask blank for EUV (Extreme Ultraviolet) lithography (hereinafter referred to also as "EUV mask blank" in this specification) to be used for e.g. production of semiconductors, and a process for its production, as well as an EUV mask obtained by patterning the EUV mask blank.

2. Discussion of Background

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (193 nm) is employed, about 45 nm is presumed to be the limit. Under the circumstances, as an exposure technique for the next generation employing an exposure wavelength shorter than 45 nm, EUV lithography is expected to be prospective, which is an exposure technique employing EUV light having a wavelength further shorter than ArF laser. In this specification, EUV light is meant for light ray having a wavelength within a soft X-ray region or within a vacuum ultraviolet region, specifically for light ray having a wavelength of from about 10 to 20 nm, particularly about 13.5 nm±0.3 nm.

EUV light is likely to be absorbed by all kinds of substances, and the refractive index of substances at such a wavelength is close to 1, whereby it is not possible to use a conventional refractive optical system like photolithography employing visible light or ultraviolet light. Therefore, in EUV lithography, a reflective optical system, i.e. a reflective photomask and mirror, is employed.

A mask blank is a laminate before pattering, to be used for the production of a photomask. In the case of an EUV mask blank, it has a structure wherein a reflective layer to reflect EUV light and an absorber layer to absorb EUV light, are formed in this order on a substrate made of e.g. glass.

Usually, a protective layer is formed between the above reflective layer and the absorber layer. Such a protective layer is provided for the purpose of protecting the reflective layer, so that the reflective layer will not be damaged by an etching process to be carried out for the purpose of forming a pattern in the absorber layer.

As the reflective layer, it is common to use a Mo/Si multilayer reflective film having a molybdenum (Mo) layer as a low refractive index layer and a silicon (Si) layer as a high refractive index layer alternately stacked to have the light reflectivity improved when the layer surface is irradiated with EUV light.

For the absorber layer, a material having a high absorption coefficient to EUV light, specifically e.g. a material containing chromium (Cr) or tantalum (Ta) as the main component, is used.

With respect to the absorber layer of an EUV mask blank, if its surface is poor in smoothness, edge roughness of a pattern formed on the absorber layer surface tends to be large, whereby the dimensional precision of the pattern tends to be low. The influence of the edge roughness tends to be distinct as the pattern becomes fine, and therefore, the absorber layer surface is required to be flat and smooth.

In order to make the absorber layer surface to be a surface excellent in smoothness, the crystal state of the absorber layer is said to be preferably an amorphous structure or a microcrystalline structure (Patent Documents 1 and 2). The present applicants have found it possible to obtain an absorber layer excellent in smoothness of the surface wherein the crystal state is an amorphous structure or a microcrystalline structure, by making the absorber layer to be a TaNH film containing tantalum (Ta), nitrogen (N) and hydrogen (H) in a specific ratio, or a TaBSiNH film containing tantalum (Ta), boron (B), silicon (Si), nitrogen (N) and hydrogen (H) in a specific ratio (Patent Documents 3 and 4).

In Patent Documents 3 and 4, between a Mo/Si multilayer reflective film and an absorber layer (a TaNH film or a TaBSiNH film), a protective layer is provided for the purpose of protecting the Mo/Si multilayer reflective film, so that at the time of forming a pattern on the absorber layer by an etching process, usually by a dry etching process, the Mo/Si multilayer reflective film will not be damaged by the etching process. As the material to constitute the protective layer, a material which is less susceptible to an influence by the etching process of the absorber layer i.e. one having an etching rate slower than the absorber layer and yet being less susceptible to a damage by the etching process, is selected for use. Further, the protective layer itself should also preferably have a high EUV light reflectivity in order not to impair the EUV light reflectivity of the Mo/Si multilayer reflective film even after the formation of the protective layer. For this purpose, In Patent Documents 3 and 4, a Ru layer or a Ru compound (RuB, RuNb or RuZr) layer is said to be preferred as the protective layer.

PRIOR ART DOCUMENTS

Patent Documents

Patent Document 1: JP-A-2004-6798
Patent Document 2: JP-A-2004-6799
Patent Document 3: WO2009/116348
Patent Document 4: WO2011/071123

SUMMARY OF INVENTION

Technical Problem

As disclosed in Patent Documents 1 to 4, an absorber layer to be formed on a protective layer is capable of forming a surface excellent in smoothness when its crystal state is an amorphous structure or a microcrystalline structure. However, the absorber layer surface is required to have a still higher level of smoothness for future, and the composition of the material to constitute such an absorber layer is required to be controlled to be in such a range that more suitable smoothness can be realized, whereby a high yield may not be expected. Further, even if the composition can be controlled in such a range that the smoothness is excellent, it is considered that depending upon the material of the absorber layer, the etching rate may tend to be slow. Therefore, it is desired to realize an absorber layer which is excellent in smoothness in a wide composition range.

In order to solve the above problem of the prior art, it is an object of the present invention to provide a process for producing an EUV mask blank which is excellent in the properties as an EUV mask blank and which has an absorber layer presenting high smoothness in a wide composition range, and such an EUV mask blank.

Solution to Problem

As a result of an extensive study to solve the above problem, the present inventors have found it possible to obtain an EUV mask blank which is excellent in the properties as an EUV mask blank and which has an absorber layer excellent in smoothness in a wide composition range, by forming an absorber layer containing Ta and N as its components after forming a Si thin film on a Ru layer or a Ru compound layer formed as a protective layer.

The present invention has been made based on the above discovery by the present inventors and provides a process for producing a reflective mask blank for EUV lithography (EUVL), which comprises forming a multilayer reflective film for reflecting EUV light on a film-forming surface of a substrate, then forming a protective layer for protecting the multilayer reflective film, on the multilayer reflective film, and forming an absorber layer for absorbing EUV light, on the protective layer, to produce a reflective mask blank for EUVL, wherein the multilayer reflective film is a Mo/Si multilayer reflective film, the protective layer is a Ru layer or a Ru compound layer, the absorber layer is a layer containing at least Ta and N, and after forming the Mo/Si multilayer reflective film, the protective layer is formed, and after forming a Si thin film or Si oxide thin film having a thickness of at most 2 nm on the protective layer, the absorber layer is formed.

Further, the present invention provides a process for producing a reflective mask blank for EUV lithography (EUVL), which comprises forming a multilayer reflective film for reflecting EUV light on a film-forming surface of a substrate, then forming a protective layer for protecting the multilayer reflective film, on the multilayer reflective film, forming an absorber layer for absorbing EUV light, on the protective layer, and forming a low reflective layer to an inspection light to be used for inspection of a mask pattern, on the absorber layer, to produce a reflective mask blank for EUVL, wherein the multilayer reflective film is a Mo/Si multilayer reflective film, the protective layer is a Ru layer or a Ru compound layer, the absorber layer is a layer containing at least Ta and N, the low reflective layer is a layer containing at least Ta and O, and after forming the Mo/Si multilayer reflective film, the protective layer is formed, and after forming a Si thin film or Si oxide thin film having a thickness of at most 2 nm on the protective layer, the absorber layer is formed.

In the process for producing an EUV mask blank of the present invention, the absorber layer is preferably one member selected from the group consisting of TaN, TaNH, TaBN, TaGaN, TaGeN, TaSiN, TaBSiN and PdTaN.

In the process for producing an EUV mask blank of the present invention, the low reflective layer is preferably one member selected from the group consisting of TaON, TaBON, TaBSiO, TaBSiON, TaGeON, TaOH, TaONH, TaBONH, TaBSiOH, TaBSiONH and TaGeONH.

In the process for producing an EUV mask blank of the present invention, it is preferred that after forming the Mo/Si multilayer reflective film, the surface of a Si layer as the uppermost layer of the Mo/Si multilayer reflective film is exposed to a nitrogen-containing atmosphere without exposing it to the atmospheric air, and then, the protective layer is formed.

Further, the present invention provides a reflective mask blank for EUV lithography obtained by the process for producing an EUV mask blank of the present invention.

Further, the present invention provides a reflective mask blank for EUV lithography comprising a substrate, and a multilayer reflective film for reflecting EUV light, a protective layer for protecting the multilayer reflective film and an absorber layer for absorbing EUV light, formed in this order on the substrate, wherein the multilayer reflective film is a Mo/Si multilayer reflective film, the protective layer is a Ru layer or a Ru compound layer, which contains N, the absorber layer is a layer containing at least Ta and N, and a Si thin film or Si oxide thin film having a thickness of at most 2 nm is formed between the protective layer and the absorber layer.

Further, the present invention provides a reflective mask blank for EUV lithography comprising a substrate, and a multilayer reflective film for reflecting EUV light, a protective layer for protecting the multilayer reflective film, an absorber layer for absorbing EUV light and a low reflective layer to an inspection light to be used for inspection of a mask pattern, formed in this order on the substrate, wherein the multilayer reflective film is a Mo/Si multilayer reflective film, the protective layer is a Ru layer or a Ru compound layer, which contains N, the absorber layer is a layer containing at least Ta and N, the low reflective layer is a layer containing at least Ta and O, and a Si thin film or Si oxide thin film having a thickness of at most 2 nm is formed between the protective layer and the absorber layer.

In the EUV mask blank of the present invention, the absorber layer is preferably one member selected from the group consisting of TaN, TaNH, TaBN, TaGaN, TaGeN, TaSiN, TaBSiN and PdTaN.

In the EUV mask blank of the present invention having a low reflective layer, the low reflective layer is preferably one member selected from the group consisting of TaON, TaBON, TaBSiO, TaBSiON, TaGeON, TaOH, TaONH, TaBONH, TaBSiOH, TaBSiONH and TaGeONH.

In the EUV mask blank of the present invention, it is preferred that the uppermost layer of the multilayer reflective film is a Si film, and an intermediate layer containing Si and N is formed between the uppermost layer of the multilayer reflective film and the protective layer.

In the EUV mask blank of the present invention, the thickness of the protective layer is preferably from 1 to 10 nm.

In the EUV mask blank of the present invention, it is preferred that the intermediate layer is composed of a first layer and a second layer from the multilayer reflective film side, in the intermediate layer, the first layer contains from 0.5 to 25 at % of nitrogen and from 75 to 99.5 at % of Si, the second layer contains from 0.1 to 10 at % of nitrogen and from 0.1 to 30 at % of Si, and the total thickness of the first layer and the second layer is from 0.2 to 2.5 nm, and the protective layer contains substantially no Si.

Further, the present invention provides a reflective mask for EUV lithography (hereinafter referred to also as an "EUV mask of the present invention") obtained by patterning the EUV mask blank of the present invention.

Advantageous Effect of Invention

According to the present invention, it is possible to obtain an EUV mask blank which is excellent in the properties as an EUV mask blank and which has an absorber layer excellent in smoothness in a wide composition range.

PREFERRED EMBODIMENTS OF INVENTION

Now, the present invention will be described with reference to the drawings.

Figure 1:
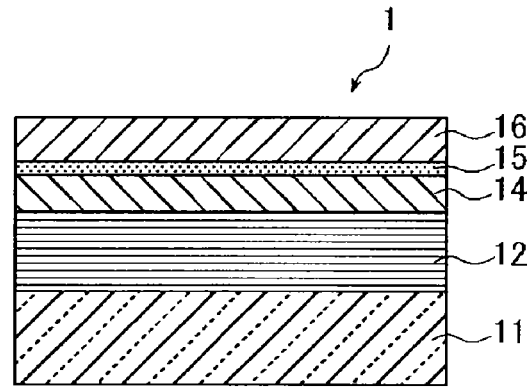
FIG. 1 is a schematic cross-sectional view illustrating an embodiment of the EUV mask blank to be produced by the process of the present invention.

FIG. 1 is a schematic cross-sectional view illustrating one embodiment of the EUV mask blank to be produced by the process of the present invention. An EUV mask blank 1 shown in FIG. 1 has a reflective layer 12 to reflect EUV light, a protective layer 14 to protect the reflective layer 12, and an absorber layer 16 to absorb EUV light, formed in this order on a film-forming surface of a substrate 11. However, in the EUV mask blank 1 to be produced by the process of the present invention, a Si thin film 15 is formed between the protective layer 14 and the absorber layer 16. Here, as mentioned later, the Si thin film 15 may be a Si oxide thin film i.e. a $SiO_x$ film ($0 < x \leq 2$).

Now, the respective constituting elements of the EUV mask blank 1 will be described.

The substrate 11 is required to satisfy the properties as a substrate for an EUV mask blank.

Therefore, the substrate 11 is preferably one which has a low thermal expansion coefficient (preferably $0 \pm 1.0 \times 10^{-7}/°$C., more preferably $0 \pm 0.3 \times 10^{-7}/°$C., further preferably $0 \pm 0.2 \times 10^{-7}/°$C., still further preferably $0 \pm 0.1 \times 10^{-7}/°$C., particularly preferably $0 \pm 0.05 \times 10^{-7}/°$C.) and which is excellent in smoothness, planarity and durability against a cleaning liquid to be used for e.g. cleaning of a mask blank or a photomask after forming a pattern. As the substrate 11, specifically, glass having a low thermal expansion coefficient, e.g. $SiO_2$—$TiO_2$ type glass, may be used. However, the substrate is not limited thereto, and it is possible to employ a substrate of e.g. crystallized glass having β-quartz solid solution precipitated, quartz glass, silicon or metal. Further, a film such as a stress-correcting film may be formed on the substrate 11.

The substrate 11 preferably has a smooth surface having a surface roughness of at most 0.15 nm rms and a planarity of at most 100 nm, whereby a high reflectivity and transfer precision can be attained by a photomask after forming a pattern.

The size, thickness, etc. of the substrate 11 are suitably determined depending upon e.g. the designed values for the mask. In Examples given hereinafter, a $SiO_2$—$TiO_2$ type glass having a size of 6 inch (152.4 mm) square and a thickness of 0.25 inch (6.3 mm) was used.

It is preferred that no defect is present on the film-forming surface i.e. the surface of the substrate 11 on the side where a reflective layer (a multilayer reflective film) 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The property particularly required for the reflective layer 12 of the EUV mask blank is a high EUV light reflectivity. Specifically, when light ray within an EUV wavelength region is applied at an incident angle of 6° to the surface of the reflective layer 12, the maximum value of the reflectivity of light ray in the vicinity of a wavelength of 13.5 nm is preferably at least 60%, more preferably at least 63%, further preferably 65%. Further, even in a case where an intermediate layer 13 and a protective layer 14 are formed on the reflective layer 12, the maximum value of the reflectivity of light ray in the vicinity of a wavelength of 13.5 nm is preferably at least 60%, more preferably at least 63%, further preferably 65%.

As a reflective layer for an EUV mask blank, a multilayer reflective film having a high refractive index layer and a low refractive index layer alternately stacked plural times is widely used, since a high reflectivity can thereby be accomplished in the EUV wavelength region. In the EUV mask blank of the present invention, a Mo/Si multilayer reflective film is employed wherein a Mo layer as a low refractive index layer and a Si layer as a high refractive index layer are alternately stacked plural times.

In the case of the Mo/Si multilayer reflective film, in order to obtain a reflective layer 12 having the maximum value of the EUV light reflectivity being at least 60%, a Mo layer having a thickness of 2.3±0.1 nm and a Si layer having a thickness of 4.5±0.1 nm may be stacked repeatedly so that the number of repeating units becomes from 30 to 60.

Here, each layer constituting the Mo/Si multilayer reflective film may be formed to have a desired thickness by means of a well-known film-forming method such as a magnetron sputtering method or an ion beam sputtering method. For example, in the case of forming a Mo/Si multilayer reflective film by means of an ion beam sputtering method, it is preferred that a Mo layer is formed to have a thickness of 2.3 nm at an ion accelerating voltage of from 300 to 1,500 V and a film-deposition rate of 0.03 to 0.30 nm/sec by using a Mo target as the target and an Ar gas (gas pressure: $1.3 \times 10^{-2}$ Pa to $2.7 \times 10^{-2}$ Pa) as the sputtering gas, and then a Si layer is formed to have a thickness of 4.5 nm at an ion accelerating voltage of from 300 to 1,500 V and a film-deposition rate of from 0.03 to 0.30 nm/sec by using a Si target as the target and an Ar gas (gas pressure: $1.3 \times 10^{-2}$ Pa to $2.7 \times 10^{-2}$ Pa) as the sputtering gas. When this operation is taken as one cycle, the Mo/Si multilayer reflective film is formed by stacking the Mo layer and the Si layer by from 30 to 60 cycles.

The protective layer 14 is provided for the purpose of protecting the reflective layer 12, so that at the time of forming a pattern in the absorber layer 16 by an etching process, specifically by a dry etching process using a chlorine-type gas as the etching gas, the reflective layer 12 will not be damaged by the etching process. Accordingly, as the material for the protective layer 14, a material hardly susceptible to an influence by the etching process of the absorber layer 16 i.e. having an etching rate slower than the absorber layer 16 and yet being hardly susceptible to damage by such an etching process, is selected for use.

Further, the protective layer 14 is preferably such that the protective layer 14 itself also has a high EUV light reflectivity in order not to impair the EUV light reflectivity at the reflective layer 12 even after forming the protective layer 14.

In the present invention, in order to satisfy the above conditions, as the protective layer 14, a Ru layer or a Ru compound layer may, for example, be formed. Such a Ru compound is preferably made of at least one member selected from the group consisting of RuB, RuNb and RuZr. In a case where the protective layer 14 is a Ru compound layer, the content of Ru is preferably at least 50 at %, more preferably at least 80 at %, particularly preferably at least 90 at %. However, in a case where the protective layer 14 is a RuNb layer, the content of Nb in the protective layer 14 is preferably from 5 to 40 at %, particularly preferably from 5 to 30 at %.

The thickness of the protective layer 14 is preferably in a range of from 1 to 10 nm, whereby the EUV light reflectivity can be increased and an etching resistant characteristic can be obtained. The thickness of the protective layer 14 is more preferably in a range of from 1 to 5 nm, further preferably in a range of from 2 to 4 nm.

The protective layer 14 may be formed by means of a well-known film forming method such as a magnetron sputtering method or an ion beam sputtering method.

In a case where a Ru layer is formed as the protective layer 14 by means of an ion beam sputtering method, discharge may be made in an argon (Ar) atmosphere by using a Ru target as the target.

Specifically, the ion beam sputtering may be carried out under the following conditions.

Sputtering gas: Ar (gas pressure: from $1.3\times10^{-2}$ Pa to $2.7\times10^{-2}$ Pa)

Ion accelerating voltage: from 300 to 1,500 V

Film forming rate: from 0.03 to 0.30 nm/sec

In an EUV mask blank 1 to be produced by the process of the present invention, a Si thin film having a thickness of at most 2 nm is formed between the protective layer 14 and the absorber layer 16. Here, as the Si thin film, even a Si oxide film i.e. SiO$_x$ (0<x≤2) exhibits the same effects. And in a case where a Si oxide film is to be formed, it may be formed by forming a Si thin film, followed by exposing it to the atmospheric air, or by forming a Si thin film in an oxygen atmosphere. The reason for forming a Si thin film 15 between the protective layer 14 and absorber layer 16 is as follows.

In the present invention, a Si thin film formed on the protective layer 14 has a high thermal stability in an amorphous state relatively metastable as a structure which Si will take. Therefore, as will be described later, for the absorber layer containing at least Ta and N, within a wide range of the composition ratio of Ta to N (Ta:N) being from 9:1 to 3:7, it will be easy to take a structure wherein the proportion occupied by amorphous as its crystal state is high.

However, if the thickness of the Si thin film 15 becomes thick, such will be influential against the characteristics of the EUV mask blank, specifically against the reflection characteristics of the absorber layer during irradiation with EUV light. Accordingly, the thickness of the Si thin film 15 is required to be at most 2 nm.

The thickness of the Si thin film 15 is preferably at most 1 nm, more preferably at most 0.8 nm, further preferably at most 0.5 nm.

So long as the Si thin film has a thickness of at most 2 nm, the lower limit in the thickness is not limited. When the thickness is thin, it may not cover the entire surface of the protective layer 14, and a part of the surface of the protective layer 14 may be exposed. Even in such as case, the absorber layer 16 to be formed on the Si thin film 15 tends to easily take a structure wherein the proportion occupied by amorphous as its crystal state is high. However, in such a case, the Si thin film or the Si oxide film is to cover preferably at least 25%, more preferably at least 50%, further preferably at least 75%, by the area ratio to the surface of the protective layer 14, in such a state that its density in the area of the surface on which the Si thin film 15 is formed, is not disproportionate. That is, in a planar view of the Si thin film 15, the shape of the film may include e.g. an island shaped or network shaped film.

The Si thin film 15 may be formed so as to have a desired thickness by means of a well-known film forming method such as a magnetron sputtering method or an ion beam sputtering method. For example, in a case where a Si thin film 15 is to be formed by means of an ion beam sputtering method, film-forming may be conducted to have a thickness of at most 2 nm by using a Si target as the target and Ar gas as the sputtering gas (gas pressure: from $1.3\times10^{-2}$ Pa to $2.7\times10^{-2}$ Pa) at an ion accelerating voltage of from 300 to 1,500 V at a film forming rate of from 0.03 to 0.30 nm/sec.

The property particularly required for the absorber layer 16 is that the EUV light reflectivity is very low. Specifically, when the surface of the absorber layer 16 is irradiated with light ray within a wavelength region of EUV light, the maximum light ray reflectivity in the vicinity of a wavelength of 13.5 nm is preferably at most 0.5%, more preferably at most 0.1%.

In order to attain such a property, it is preferably constituted by a material having a high absorption coefficient of EUV light, and it is preferably a layer containing at least Ta and N.

As the layer containing Ta and N, it is preferred to use one member selected from the group consisting of TaN, TaNH, TaBN, TaGaN, TaGeN, TaSiN, TaBSiN and PdTaN. Examples of preferred compositions of such absorber layers are as follows.

TaN Layer

Content of Ta: preferably from 30 to 90 at %, more preferably from 40 to 80 at %, further preferably from 40 to 70 at %, particularly preferably from 50 to 70 at %

Content of N: preferably from 10 to 70 at %, more preferably from 20 to 60 at %, further preferably from 30 to 60 at %, particularly preferably from 30 to 50 at %

TaNH Layer

Total content of Ta and N: preferably from 50 to 99.9 at %, more preferably from 90 to 98 at %, further preferably from 95 to 98 at %

Content of H: preferably from 0.1 to 50 at %, more preferably from 2 to 10 at %, further preferably from 2 to 5 at %

Composition ratio of Ta to N (Ta:N): preferably from 9:1 to 3:7, more preferably from 7:3 to 4:6, further preferably from 7:3 to 5:5

TaBN layer

Total content of Ta and N: preferably from 75 to 95 at %, more preferably from 85 to 95 at %, further preferably from 90 to 95 at %

Content of B: preferably from 5 to 25 at %, more preferably from 5 to 15 at %, further preferably from 5 to 10 at %

Composition ratio of Ta to N (Ta:N): preferably from 9:1 to 3:7, more preferably from 7:3 to 4:6, further preferably from 7:3 to 5:5

TaBSiN Layer

Content of B: at least 1 at % and less than 5 at %, preferably from 1 to 4.5 at %, more preferably from 1.5 to 4 at %

Content of Si: from 1 to 25 at %, preferably from 1 to 20 at %, more preferably from 2 to 12 at %

Composition ratio of Ta to N (Ta:N): from 8:1 to 1:1

Content of Ta: preferably from 50 to 90 at %, more preferably from 60 to 80 at %

Content of N: preferably from 5 to 30 at %, more preferably from 10 to 25 at %

PdTaN Layer

Total content of Ta and N: preferably from 30 to 80 at %, more preferably from 30 to 75 at %, further preferably from 30 to 70 at %

Content of Pd: preferably from 20 to 70 at %, more preferably from 25 to 70 at %, further preferably from 30 to 70 at %

Composition ratio of Ta to N (Ta:N): preferably from 1:7 to 3:1, more preferably from 1:3 to 3:1, further preferably from 3:5 to 3:1

In the present invention, using the Si thin film 15 as an underlayer, the absorber layer 16 having the above composition i.e. the layer containing at least Ta and N is formed, whereby the absorber layer 16 tends to easily take a structure wherein the proportion occupied by amorphous in its crystal state is higher than microcrystalline, and thus is excellent in the surface smoothness.

The surface roughness of the surface of the absorber layer 16 is preferably at most 0.5 nm rms. If the surface roughness of the surface of the absorber layer 16 is large, the edge roughness of a pattern to be formed in the absorber layer 16 tends to be large, and the dimensional precision of the pattern tends to be poor. As the pattern becomes fine, the influence of the edge roughness becomes distinct, and therefore, the surface of the absorber layer 16 is required to be smooth.

When the surface roughness of the surface of the absorber layer 16 is at most 0.5 nm rms, the surface of the absorber layer 16 is sufficiently smooth and free from deterioration in the dimensional precision of a pattern due to an influence of the edge roughness. Further, the surface roughness of the surface of the absorber layer 16 is more preferably at most 0.45 nm rms, further preferably at most 0.4 nm rms.

Being a layer containing at least Ta and N, the absorber layer 16 has a high etching rate when dry etching is carried out by using a chlorine-type gas as the etching gas, and the etching selectivity to the protective layer 14 is at least 10. In this specification, the etching selectivity can be calculated by the following formula:

Etching selectivity=(etching rate of absorber layer 16)/(etching rate of protective layer 14)

The etching selectivity is preferably at least 10, more preferably at least 11, further preferably at least 12.

Further, the Si thin film 15 present between the protective layer 14 and the absorber layer 16 has a high etching rate when dry etching is carried out by using a chlorine-type gas as the etching gas, and the etching selectivity for absorber layer 16 to Si thin film 15 obtained by the following formula is at most ½, and further, the thickness of the Si thin layer is extremely thin at a level of at most 2 nm. Therefore, an influence of the Si thin film 15 during patterning in the absorber layer 16 is negligible.

Etching selectivity for absorber layer 16 to Si thin film 15=(etching rate of absorber layer 16)/(etching rate of Si thin film)

Further, the thickness of the absorber layer 16 is preferably in a range of from 50 to 100 nm. The absorber layer 16 of the present invention can be formed by using a film forming method such as a sputtering method, such as a magnetron sputtering method or an ion beam sputtering method.

Figure 2:
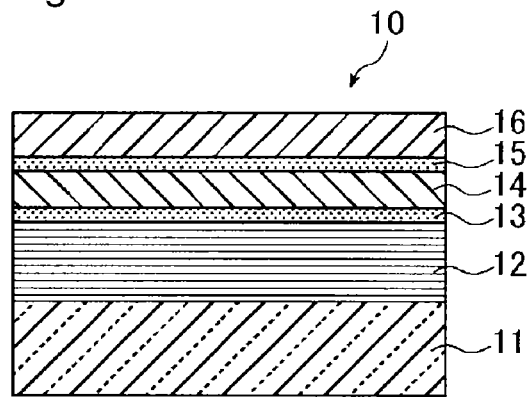
FIG. 2 is a schematic cross-sectional view illustrating another embodiment of the EUV mask blank to be produced by the process of the present invention.

Further, like an EUV mask blank 10 shown in FIG. 2, in the EUV mask blank to be produced by the process of the present invention, an intermediate layer 13 containing Si and N may be formed between the reflective layer 12 and the protective layer 14. As the present applicants have mentioned in Patent Document 4, the main factor of deterioration of the reflectivity of EUV light is acceleration of oxidation from the upper portion of the EUV mask blank rather than diffusion of Si into the protective layer from the Si layer as the uppermost layer of the multilayer reflective film, i.e. it is mainly due to oxidation from the upper side film rather than the Mo/Si multilayer reflective film. Thus, in order to prevent the deterioration of the reflectivity of EUV light due to oxidation, it is sufficient to prevent the oxidation from the upper layer of the Mo/Si multilayer reflective film, i.e. from the protective layer. By taking this construction, it is possible to prevent deterioration of the reflectivity of EUV light by oxidation from the protective layer 14.

In the EUV mask blank 10 to be produced by the process of the present invention, it is possible to prevent deterioration in the EUV light reflectivity due to oxidation from the protective layer 14, by forming an intermediate layer 13 containing Si and N, between the reflective layer 12 and the protective layer 14. The reason as to why deterioration in the EUV light reflectivity due to oxidation from the protective layer 14 is prevented by forming the intermediate layer 13 containing Si and N in this manner, is considered to be as follows.

It is considered that as the intermediate layer 13 contains Si and N, it has a high EUV light reflectivity after the film formation and also has an effect to prevent oxidation. Thus, even in a situation where the protective layer 14 is likely to be oxidized in a step to be carried out during the production of the EUV mask blank or a step to be carried out during the production of a photomask from the EUV mask blank (such as in each step of cleaning, defect inspection, heating, dry etching, defect correction or the like) or during the EUV exposure, by the presence of the intermediate layer 13 having the effect to prevent oxidation, it is considered possible to prevent deterioration of the EUV light reflectivity. That is, it is considered possible to prevent oxidation of the Mo/Si multilayer reflective film present beneath the intermediate layer 13, more specifically, oxidation of the Si layer as the uppermost layer of the Mo/Si multilayer reflective film, and as a result, it is possible to prevent deterioration in the EUV light reflectivity due to oxidation from the protective layer 14.

Here, by the formation of the intermediate layer 13 between the reflective layer 12 (Mo/Si multilayer reflective film) and the protective layer 14, it is also possible to prevent diffusion of Si in the Si layer as the uppermost layer of the Mo/Si multilayer reflective film into the protective layer 14 during the formation of the protective layer 14.

The intermediate layer 13 preferably contains from 75 to 99.5 at % of Si and from 0.5 to 25 at % of N.

If the content of N in the intermediate layer 13 is less than 0.5 at %, it is likely that the above-described effect to prevent further oxidation tends to be inadequate, whereby it is likely that the effect to prevent deterioration in the EUV light reflectivity due to oxidation from the protective layer 14 tends to be inadequate.

As described in detail hereinafter, the intermediate layer 13 containing Si and N can be formed in such a manner that after forming the Mo/Si multilayer reflective film, the surface of the Si layer as the uppermost layer of the Mo/Si multilayer reflective film is exposed to a nitrogen-containing atmosphere without exposing it to the atmospheric air. However, in a case where the content of N in the intermediate layer 13 exceeds 25 at %, it is considered that N was present in the atmosphere for the film formation either during the film formation of the Si layer as the uppermost layer of the Mo/Si multilayer reflective film, or during the film formation of the protective layer 14 to be formed on the intermediate layer 13, or during the film formation of both. In the film formation in the atmosphere where N is present, it is likely that defects will increase during the film formation.

The intermediate layer 13 contains more preferably from 85 to 99.5 at % of Si and from 0.5 to 15 at % of N, further preferably from 90 to 99.5 at % of Si and from 0.5 to 10 at % of N, still further preferably from 91 to 99 at % of Si and from 1 to 9 at % of N, still further preferably from 91 to 97 at % of Si and from 3 to 9 at % of N, particularly preferably from 92 to 95 at % of Si and from 5 to 8 at % of N.

The intermediate layer 13 preferably contains no F (fluorine), since otherwise, Si in the intermediate layer 13 is likely to be eroded. Further, the intermediate layer 13 preferably contains no C (carbon) or H (hydrogen), since if C or H is contained in the intermediate layer 13, it is likely to react with O (oxygen) in the intermediate layer 13, whereby O is discharged in the intermediate layer 13 to deteriorate the structure of the intermediate layer 13. For these reasons, the contents of F, C and H in the intermediate layer 13 are preferably at most 3 at %, more preferably at most 1 at %, respectively. Further, the intermediate layer 13 preferably does not contain an element such as Ni, Y, Ti, La, Cr or Rh, since if such an element is contained in the intermediate layer 13, the surface roughness is likely to increase due to differences in the etching rates when the EUV mask blank is subjected to etching. For this reason, the contents of Ni, Y, Ti, La, Cr and Rh in the intermediate layer 13, are preferably at most 3 at %, more preferably at most 1 at %, respectively.

Further, the content of oxygen in the intermediate layer 13 is also preferably at most 3 at %, more preferably at most 1 at %.

The thickness of the intermediate layer 13 is preferably in a range of from 0.2 to 2.5 nm, more preferably from 0.4 to 2 nm, further preferably from 0.5 to 1.5 nm, from the viewpoint of the effect to prevent deterioration in the EUV light reflectivity due to oxidation from the protective layer 14. Further, the thickness of the Si layer as the uppermost layer of the multilayer reflective film is preferably in a range of from 2 to 4.8 nm, particularly preferably from 2.5 to 4 nm, in order to form the intermediate layer 13 by exposing it to the nitrogen-containing atmosphere.

After forming the Mo/Si multilayer reflective film, the intermediate layer 13 containing Si and N can be formed by exposing the surface of the Si layer as the uppermost layer of the Mo/Si multilayer reflective film to a nitrogen-containing atmosphere without exposing it to the atmospheric air, thereby to slightly nitride the surface of the Si layer, i.e. to incorporate nitrogen to the surface of the Si layer. Here, in this specification, the nitrogen-containing atmosphere means a nitrogen gas atmosphere or a mixed gas atmosphere of nitrogen gas and an inert gas such as argon. In the case of such a mixed gas atmosphere, the nitrogen gas concentration in the atmosphere is preferably at least 20 vol %, more preferably at least 50 vol %, further preferably at least 80 vol %.

Here, after forming the Mo/Si multilayer reflective film, the surface of the Si layer as the uppermost layer of the Mo/Si multilayer reflective film is exposed to the nitrogen-containing atmosphere without exposing it to the atmospheric air, for such a reason that if the Si layer surface is exposed to the atmospheric air before exposing it to the nitrogen atmosphere, the Si layer surface is oxidized, and even if thereafter exposed to the nitrogen atmosphere, nitrogen cannot be incorporated to the Si layer surface by nitriding of the Si layer surface, whereby it is likely that it is not possible to form an intermediate layer 13 containing Si and N.

The nitrogen-containing atmosphere to which the Si layer surface is exposed, is preferably such that the product of the nitrogen partial pressure (Torr) and the exposure time (s) is preferably at least $1\times10^{-6}$ Torr·s (=1 L (Langmuir)). In a case where the nitrogen partial pressure is represented by Pa, the product of the nitrogen partial pressure (Pa) of the nitrogen-containing atmosphere and the exposure time (s) is preferably at least $1.33\times10^{-4}$ Pa·s.

The product of the nitrogen partial pressure and the exposure time is an index showing a frequency of impingement of nitrogen in the nitrogen-containing atmosphere to the Si layer surface, and in this specification, it may sometimes be referred to as a "exposure amount of nitrogen". In order to form the intermediate layer 13 containing Si and N by nitriding of the Si layer surface, such a value is preferably at least $1\times10^{-6}$ Torr·s (at least $1.33\times10^{-4}$ Pa·s), more preferably at least $1\times10^{-3}$ Torr·s (at least $1.33\times10^{-1}$ Pa·s), further preferably at least $1\times10^{-2}$ Torr·s (at least 1.33 Pa·s), particularly preferably at least $1\times10^{-1}$ Torr·s (at least 13.3 Pa·s).

Here, the nitrogen partial pressure in the nitrogen-containing atmosphere to which the Si layer surface is exposed, is preferably from $1\times10^{-4}$ Torr to 820 Torr (from $1.33\times10^{-2}$ Pa to 109.32 kPa).

Here, in a case where the nitrogen-containing atmosphere is a nitrogen gas atmosphere, the above nitrogen partial pressure means the atmosphere pressure of the nitrogen gas atmosphere.

In order to prevent oxidation of the Si layer surface, it is preferred that the oxygen concentration in the nitrogen-containing atmosphere to which the Si layer surface is exposed, is very low. Specifically, in a case where the nitrogen partial pressure in the nitrogen-containing atmosphere is within the above range, i.e. in a case where the nitrogen partial pressure in the nitrogen-containing atmosphere is from $1\times10^{-4}$ Torr to 820 Torr (from $1.33\times10^{-2}$ Pa to 109.32 kPa), it is preferred that the oxygen partial pressure in the atmosphere is at most $1\times10^{-6}$ Torr ($1.33\times10^{-4}$ Pa).

Further, in order to prevent oxidation of the Si layer surface, it is preferred that the concentrations of $O_3$, $H_2O$ and OH in the nitrogen-containing atmosphere to which the Si layer surface is exposed, are also very low. Specifically, in a case where the nitrogen partial pressure in the nitrogen-containing atmosphere is within the above range, i.e. in a case where the nitrogen partial pressure in the nitrogen-containing atmosphere is from $1\times10^{-4}$ Torr to 820 Torr (from $1.33\times10^{-2}$ Pa to 109.32 kPa), the partial pressures of $O_3$, $H_2O$ and OH in the atmosphere are preferably at most $1\times10^{-6}$ Torr ($1.33\times10^{-4}$ Pa), respectively.

Further, the concentration of $F_2$ in the nitrogen-containing atmosphere is also preferably very low, since otherwise the Si layer is likely to be thereby eroded. Specifically, in a case where the nitrogen partial pressure in the nitrogen-containing atmosphere is within the above range, i.e. in a case where the nitrogen partial pressure in the nitrogen-containing atmosphere is from $1\times10^{-4}$ Torr to 820 Torr (from $1.33\times10^{-2}$ Pa to 109.32 kPa), the partial pressure of $F_2$ in the atmosphere is preferably at most $1 \times 10^{-6}$ Torr.

Further, the temperature of the nitrogen-containing atmosphere to which the Si layer surface is exposed, is preferably from 0 to 170° C. If the temperature of the nitrogen-containing atmosphere is less than 0° C., a problem of an influence due to adsorption of the residual moisture in vacuum is likely to occur. If the temperature of the nitrogen-containing atmosphere exceeds 170° C., it is likely that nitriding of the Si layer proceeds excessively, thus leading to deterioration in the EUV light reflectivity of the Mo/Si multilayer reflective film.

The temperature of the nitrogen-containing atmosphere is more preferably from 10 to 160° C., further preferably from 20 to 150° C.

Further, as described hereinafter, at the time of exposing the Si layer surface to the nitrogen-containing atmosphere, the Si layer surface may be thermally treated within the above temperature range.

Further, by forming the intermediate layer 13 by exposing the surface of the Si layer as the uppermost layer of the Mo/Si multilayer reflective film to the nitrogen-containing atmosphere to slightly nitride the Si layer i.e. to incorporate nitrogen in the Si layer surface, it is possible to improve the durability against oxidation without deterioration in the EUV light reflectivity after the film formation of the protective layer 14, such being desirable.

In Example 1 given hereinafter, the time for exposing the Si layer surface to the nitrogen-containing atmosphere is set to be 600 sec, but the time for exposing the Si layer surface to the nitrogen-containing atmosphere is not limited thereto and may suitably be selected within a range to satisfy the above-described conditions relating to the nitrogen-containing atmosphere.

Further, after forming the Mo/Si multilayer reflective film, at the time of exposing the surface of the Si layer as the uppermost layer of the Mo/Si multilayer reflective film to the nitrogen-containing atmosphere without exposing it to the atmospheric air, thermal treatment may be carried out in the nitrogen-containing atmosphere to form the intermediate layer 13. By subjecting the surface of the Si layer as the uppermost layer of the Mo/Si multilayer reflective film to such thermal treatment at the time of exposing it to the nitrogen atmosphere, nitriding of the Si layer surface i.e. incorporation of nitrogen into the Si layer surface, is accelerated.

Here, in order to carry out, after forming the Mo/Si multilayer reflective film, thermal treatment of the surface of the Si layer as the uppermost layer of the Mo/Si multilayer reflective film in the nitrogen-containing atmosphere without exposing it to the atmospheric air, after the formation of the Si layer, while maintaining the substrate having the Mo/Si multilayer reflective film formed thereon, in the film-forming chamber wherein the Si layer has been formed or in a chamber adjacent to such a film-forming chamber, the gas in the chamber is replaced with nitrogen gas (or a mixed gas of nitrogen gas with an inert gas such as argon), and the Si layer may be thermally treated in such a replaced gas.

The thermal treatment temperature at the time of thermally treating the Si layer surface in the nitrogen-containing atmosphere, is preferably from 120 to 160° C., particularly preferably from 130 to 150° C.

Like in the procedure shown in Example 1, the procedure for exposing in the reduced-pressure atmosphere the Si layer surface to the nitrogen gas or to the mixed gas of nitrogen gas with an inert gas such as argon, is preferably such that in a case where film forming of the Mo/Si multilayer reflective film and the film forming of the protective layer are carried out in the same chamber, it is important to evacuate the nitrogen gas (or the mixed gas of nitrogen gas with an inert gas such as argon) after carrying out the procedure for exposing the Si layer surface to the nitrogen gas (or to the mixed gas of nitrogen gas with an inert gas such as argon) and before carrying out the film formation of the protective layer. Further, this procedure is preferred also in that it is possible to control the N content in the intermediate layer 13 by controlling the exposure amount of the nitrogen gas (or the mixed gas of nitrogen gas with an inert gas such as argon) to the Si layer surface.

It has been mentioned above that after forming the Mo/Si multilayer reflective film, by subjecting the surface of the Si layer as the uppermost layer of the Mo/Si multilayer reflective film to thermal treatment with the nitrogen-containing atmosphere at the time of exposing it to the nitrogen-containing atmosphere without exposing it to the atmospheric air, it is possible to accelerate nitriding of the Si layer surface i.e. incorporation of nitrogen into the Si layer surface. The procedure is, however, not limited thereto. It is also preferred that in the case of exposing in the reduced pressure atmosphere the Si layer surface to the nitrogen gas or the mixed gas of nitrogen gas with an inert gas such as argon, the reduced pressure atmosphere is maintained in a plasma state in order to accelerate nitriding of the Si layer surface i.e. incorporation of nitrogen into the Si layer surface.

However, even in such a case, if the Si layer surface is ion-irradiated with nitrogen gas (or a mixed gas of nitrogen gas with an inert gas such as argon) ionized in a plasma state by application of a voltage, ionized nitrogen is likely to impinge on the Si layer surface in an accelerated state, whereby nitriding of the Si layer is likely to proceed excessively to cause deterioration in the EUV light reflectivity of the Mo/Si multilayer reflective film. Therefore, it is particularly preferred not to apply a voltage to the nitrogen gas (or the mixed gas of nitrogen gas with an inert gas such as argon) ionized in a plasma state, i.e. not to apply ion-irradiation, so that it is possible to control the amount of nitrogen in the intermediate layer 13 to be at a proper level.

Further, in a case where in a reduced pressure atmosphere, the Si layer surface is exposed to nitrogen gas or a mixed gas of nitrogen gas with an inert gas such as argon, it is also preferred that in the reduced pressure atmosphere, the Si layer surface is irradiated with ultraviolet rays, in order to accelerate nitriding of the Si layer surface i.e. incorporation of N into the Si layer surface.

Further, although only slightly, N is likely to diffuse into the protective layer 14 from the adjacent intermediate layer 13. The content in the protective layer 14 of N diffused from the intermediate layer 13, is preferably from 0.1 to 10 at %, more preferably from 0.1 to 5 at %.

N diffused from the intermediate layer 13 may constitute such a composition that its content in the protective layer 14 decreases as the distance from the intermediate layer 13 increases, i.e. the N content in the protective layer 14 is inclined so that the N content is high in the vicinity of the interface with the intermediate layer 13 and its content becomes low in the vicinity of the interface with the Si thin film 15.

Further, although only slightly, Si is likely to diffuse into the protective layer 14 from the adjacent intermediate layer 13. In a case where the protective layer 14 contains Si diffused from the intermediate layer 13, the content of Si in the protective layer 14, is preferably from 0.1 to 4.5 at %, more preferably from 0.1 to 4 at %. Further, even if Si or N diffuses into the protective layer 14 from the adjacent intermediate layer 13 to some extent, the properties of the protective layer 14 may not be substantially deteriorated.

Figure 3:
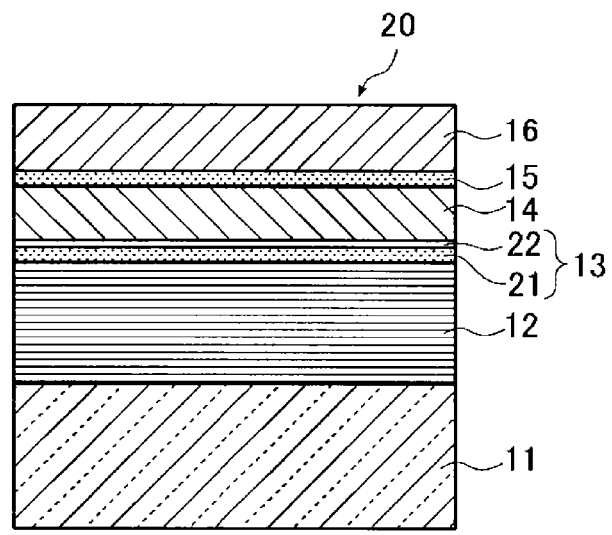
FIG. 3 is a schematic cross-sectional view illustrating still another embodiment of the EUV mask blank to be produced by the process of the present invention.

Further, in the EUV mask blank to be produced by the process of the present invention, like in an EUV mask blank 20 shown in FIG. 3, between the reflective layer 12 and the protective layer 14, an intermediate layer 13 may be formed which has a double-layer structure comprising a first layer 21 containing nitrogen and Si in predetermined amounts as mentioned later, and a second layer 22 containing Ru, nitrogen and Si in predetermined amounts as mentioned later.

The EUV mask blank 20 to be produced by the process of the present invention prevents deterioration in the EUV light reflectivity by oxidation of the Ru protective layer, by forming, between the reflective layer 12 and the protective layer 14, an intermediate layer 13 of a double layer structure comprising a first layer 21 containing from 0.5 to 25 at % of nitrogen and from 75 to 99.5 at % of Si, and a second layer 22 containing from 60 to 99.8 at % of Ru, from 0.1 to 10 at % of nitrogen and from 0.1 to 30 at % of Si. The reason as to why deterioration in the EUV light reflectivity due to oxidation of the Ru protective layer can be prevented by forming the intermediate layer 13 of a double layer structure (the first layer 21 and the second layer 22) with the above compositions between the reflective layer 12 and the protective layer 14, is considered to be as follows.

The intermediate layer 13 of the above double layer structure is considered to have a high reflectivity after the film formation and have an effect to prevent oxidation, as the first layer 21 contains nitrogen to such an extent that there is no deterioration in the reflectivity due to a large amount of nitrogen contained in the Si film.

And, the second layer 22 contains a very small amount of nitrogen in addition to Ru, whereby even in such a situation that the Ru protective layer is likely to be oxidized, it is possible to prevent oxidation of the layer structure present beneath the second layer. Thus, even in a situation where the Ru protective layer is likely to be oxidized in a step to be carried out during the production of the mask blank or a step to be carried out during the production of a photomask from the mask blank (such as in each step of cleaning, defect inspection, heating, dry etching, defect correction or the like) or during the EUV exposure, by the presence of the intermediate layer 13 having the effect to prevent oxidation, it is considered possible to prevent oxidation of the Mo/Si multilayer reflective film present beneath the intermediate layer 13, more specifically, oxidation of the Si layer as the uppermost layer of the Mo/Si multilayer reflective film, and as a result, it is possible to prevent deterioration in the EUV light reflectivity due to oxidation of the Ru protective layer.

Further, by the presence of the intermediate layer 13 of the above double layer structure between the reflective layer 12 (Mo/Si multilayer reflective film) and the protective layer 14 (Ru protective layer), it is possible to prevent diffusion of Si in the Si layer as the uppermost layer of the Mo/Si multilayer reflective film into the Ru protective layer during the formation of the protective layer 14.

If the content of nitrogen in the first layer 21 is less than 0.5 at %, it is likely that the above-described effect to prevent further oxidation tends to be inadequate, whereby it is likely that the effect to prevent deterioration in the EUV light reflectivity due to oxidation of the Ru protective layer tends to be inadequate.

As will be described in detail hereinafter, the intermediate layer 13 of the above double layer structure can be formed in such a manner that after forming the Mo/Si multilayer reflective film, the surface of the Si layer as the uppermost layer of the Mo/Si multilayer reflective film is exposed to a nitrogen-containing atmosphere. However, in a case where the content of nitrogen in the first layer 21 exceeds 25 at %, it is considered that nitrogen was added either during the film formation of the Si layer as the uppermost layer of the Mo/Si multilayer reflective film, or during the film formation of the protective layer 14 to be formed on the intermediate layer 13, or during the film formation of both. In the film formation with such addition of nitrogen, it is likely that defects will increase during the film formation and thus create a problem.

The first layer 21 contains preferably from 0.5 to 15 at % of nitrogen and from 85 to 99.5 at % of Si, more preferably from 0.5 to 10 at % of nitrogen and from 90 to 99.5 at % of Si, further preferably from 1 to 9 at % of nitrogen and from 91 to 99 at % of Si, still further preferably from 3 to 9 at % of nitrogen and from 91 to 97 at % of Si, particularly preferably from 5 to 8 at % of nitrogen and from 92 to 95 at % of Si.

If the content of Ru in the second layer 22 is less than 60 at %, the EUV light reflectivity is likely to deteriorate due to oxidation of the Ru protective layer. On the other hand, if the content of Ru in the second layer 22 exceeds 98.5 at %, the above-mentioned effect by the presence of a very small amount of nitrogen tends to be hardly obtainable.

If the content of nitrogen in the second layer 22 is less than 0.1 at %, the above-mentioned effect by the presence of a very small amount of nitrogen tends to be hardly obtainable. On the other hand, if the content of nitrogen in the second layer 22 exceeds 10 at %, the EUV light reflectivity is likely to deteriorate due to excessive nitriding of the Ru protective layer.

If the content of Si in the second layer 22 is less than 0.1 at %, the adhesion to the first layer 21 tends to be poor. On the other hand, if the content of Si in the second layer 22 exceeds 30 at %, the EUV light reflectivity is likely to deteriorate due to oxidation of the Ru protective layer.

The second layer 22 contains preferably from 60 to 99.8 at % of Ru, from 0.1 to 10 at % of nitrogen and from 0.1 to 30 at % of Si, more preferably from 75 to 99.8 at % of Ru, from 0.1 to 5 at % of nitrogen and from 0.1 to 20 at % of Si, further preferably from 90 to 99.8 at % of Ru, from 0.1 to 2.5 at % of nitrogen and from 0.1 to 7.5 at % of Si.

The respective layers (the first layer 21 and the second layer 22) constituting the intermediate layer 13 preferably contain no fluorine, since otherwise, Si in the first layer 21 and the second layer 22 constituting the intermediate layer 13 is likely to be eroded. Further, the respective layers (the first layer 21 and the second layer 22) constituting the intermediate layer 13 preferably contain no carbon or hydrogen, since if carbon or hydrogen is contained in the respective layers (the first layer 21 and the second layer 22) constituting the intermediate layer 13, it is likely to react with O (oxygen) in the respective layers (the first layer 21 and the second layer 22) constituting the intermediate layer 13, whereby O is discharged in the layers. For these reasons, the contents of F, C and H in the respective layers (the first layer 21 and the second layer 22) constituting the intermediate layer 13 are preferably at most 3 at %, more preferably at most 1 at %, respectively. Further, likewise, the content of an element such as Ni, Y, Ti, La, Cr or Rh in the respective layers (the first layer 21 and the second layer 22) constituting the intermediate layer 13, is preferably at most 3 at %, more preferably at most 1 at %.

The total thickness of the first layer 21 and the second layer 22 constituting the intermediate layer 13 is preferably from 0.2 to 2.5 nm, more preferably from 0.4 to 2 nm, further preferably from 0.5 to 1.5 nm, from the viewpoint of the effect to prevent deterioration in the EUV light reflectivity due to oxidation of the Ru protective layer. Further, the thickness of the Si layer as the uppermost layer of the multilayer reflective film is preferably from 2 to 4.8 nm, particularly preferably from 2.5 to 4 nm, in order to form the intermediate layer 13 of the above double layer structure by exposing it to the nitrogen-containing atmosphere.

The thickness of the first layer 21 is preferably from 0.1 to 2.4 nm, more preferably from 0.4 to 1.5 nm, further preferably from 0.8 to 1.3 nm, from the viewpoint of the effect to prevent deterioration in the EUV light reflectivity due to oxidation of the Ru protective layer.

The thickness of the second layer 22 is preferably from 0.1 to 2.4 nm, more preferably from 0.4 to 1.5 nm, further preferably from 0.8 to 1.2 nm, from the viewpoint of the effect to prevent deterioration in the EUV light reflectivity due to oxidation of the Ru protective layer.

Between the respective layers (the first layer 21 and the second layer 22) constituting the intermediate layer 13, the thickness of the first layer 21 should better be less from the reason for preventing deterioration of the EUV light reflectivity by excessive nitriding of the SiN layer.

The difference in thickness between the second layer 22 and the first layer 21 (i.e. thickness of second layer 22—thickness of first layer 21) is preferably from 0 to 2.3 nm, more preferably from 0 to 1.1 nm, further preferably from 0 to 0.4 nm.

After forming the Mo/Si multilayer reflective film, the intermediate layer 13 of the above double layer structure can be formed by exposing the surface of the Si layer as the uppermost layer of the Mo/Si multilayer reflective film to a nitrogen-containing atmosphere thereby to slightly nitride the surface of the Si layer.

The nitrogen-containing atmosphere to which the Si layer surface is exposed, is preferably such that the product of the nitrogen partial pressure (Torr) and the exposure time (s) is preferably at least $1 \times 10^{-6}$ Torr·s (=1 L (Langmuir)). In order to form the intermediate layer of the above double layer structure, this value is preferably at least $1 \times 10^{-6}$ Torr·s, more preferably at least $1 \times 10^{-3}$ Torr·s, further preferably at least $1 \times 10^{-2}$ Torr·s, still further preferably at least $1 \times 10^{-1}$ Torr·s.

The procedure for exposing the Si layer surface to a nitrogen-containing atmosphere is not particularly limited, so long as the nitrogen-containing atmosphere to which the Si layer surface is exposed, satisfies the above conditions. However, the procedure for exposing in the reduced-pressure atmosphere the Si layer surface to the nitrogen gas or to the mixed gas of nitrogen gas with an inert gas such as argon, is a procedure in which it is preferred to take into consideration such a point that in a case where film forming of the multilayer reflective film and the film forming of the protective layer are carried out in the same chamber, it is necessary to evacuate the nitrogen gas (or the mixed gas of nitrogen gas with an inert gas such as argon) after carrying out the procedure for exposing the Si layer surface to the nitrogen gas (or to the mixed gas of nitrogen gas with an inert gas such as argon) and before carrying out the film formation of the protective layer. Further, this procedure is preferred also in that it is possible to control the nitrogen content in the respective layers (the first layer 21 and the second layer 22) of the intermediate layer 13 by controlling the exposure amount of the nitrogen gas (or the mixed gas of nitrogen gas with an inert gas such as argon) to the Si layer surface.

Further, it is also preferred that in the case of exposing in the reduced pressure atmosphere the Si layer surface to the nitrogen gas or the mixed gas of nitrogen gas with an inert gas such as argon, the reduced pressure atmosphere is maintained in a plasma state in order to accelerate nitriding of the Si layer surface. However, even in such a case, if the Si layer surface is ion-irradiated with nitrogen gas (or a mixed gas of nitrogen gas with an inert gas such as argon) ionized in a plasma state by application of a voltage, ionized nitrogen is likely to impinge on the Si layer surface in an accelerated state, whereby nitriding of the Si layer is likely to proceed excessively to cause deterioration in the EUV light reflectivity of the Mo/Si multilayer reflective film. Therefore, it is particularly preferred not to apply a voltage to the nitrogen gas (or the mixed gas of nitrogen gas with an inert gas such as argon) ionized in a plasma state, i.e. not to apply ion-irradiation, so that it is possible to control the amount of nitrogen in the respective layers (the first layer 21 and the second layer 22) constituting the intermediate layer 13 to be at a proper level.

The temperature of the nitrogen-containing atmosphere to which the Si layer surface is exposed, is preferably from 0 to 150° C. If the temperature of the nitrogen-containing atmosphere is less than 0° C., a problem of an influence due to adsorption of the residual moisture in vacuum is likely to occur. On the other hand, if the temperature of the nitrogen-containing atmosphere exceeds 150° C., it is likely that nitriding of the Si layer proceeds excessively, thus leading to deterioration in the EUV light reflectivity of the Mo/Si multilayer reflective film.

The temperature of the nitrogen-containing atmosphere is more preferably from 10 to 140° C., further preferably from 20 to 120° C.

By forming the intermediate layer 13 of the above double layer structure by exposing the surface of the Si layer as the uppermost layer of the Mo/Si multilayer reflective film to the nitrogen-containing atmosphere, there will be no deterioration of the EUV light reflectivity after the film formation of the protective layer 14 (Ru protective layer), and it is possible to improve the oxidation durability, such being desirable.

Figure 4:
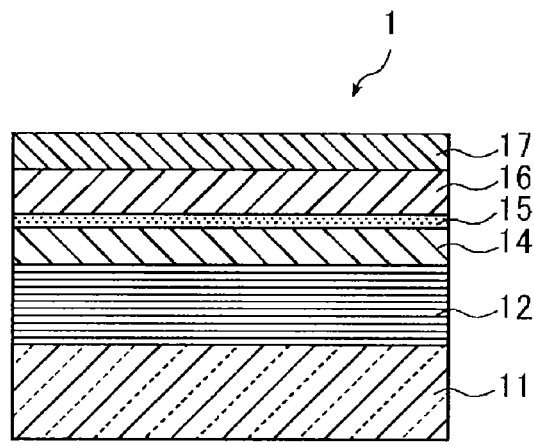
FIG. 4 is a view similar to FIG. 1, but a low reflective layer is formed on the absorber layer.
Figure 5:
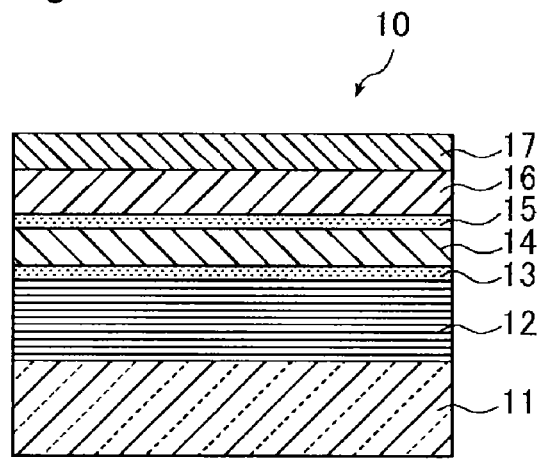
FIG. 5 is a view similar to FIG. 2, but a low reflective layer is formed on the absorber layer.
Figure 6:
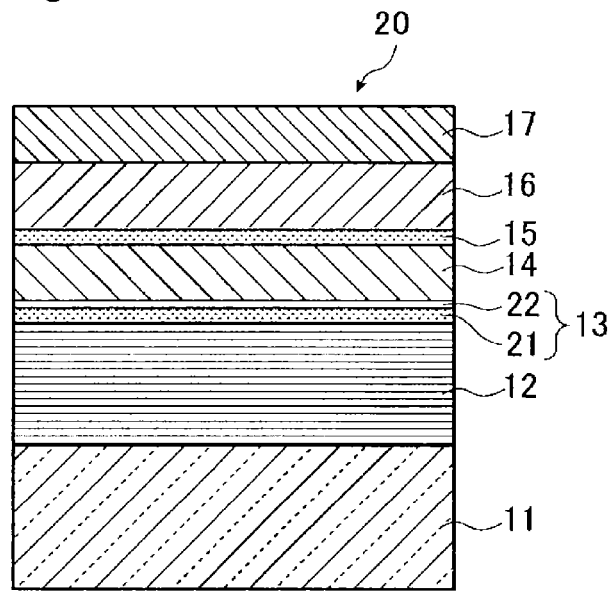
FIG. 6 is a view similar to FIG. 3, but a low reflective layer is formed on the absorber layer.

Further, like EUV mask blank 1' shown in FIG. 4, EUV mask blank 10' shown in FIG. 5 or EUV mask blank 20' shown in FIG. 6, the EUV mask blank to be produced by the process of the present invention may be such that a low reflective layer 17 to an inspection light to be used for inspection of a mask pattern is formed on the absorber layer 16.

At the time of preparing an EUV mask, after forming a pattern in the absorber layer, an inspection is conducted to see if the pattern is formed as designed. In such an inspection of a mask pattern, an inspecting machine may be used wherein light having a wavelength of about 257 nm is used as the inspection light. That is, the inspection is made by a difference in the reflectivity of such light having a wavelength of about 257 nm, specifically by the difference in the reflectivity between the surface exposed by removal of the absorber layer 16 by the formation of a pattern and the surface of the absorber layer 16 remained without being removed by the formation of the pattern. Here, the former is the surface of the protective layer 14. Therefore, if the difference in the reflectivity between the surface of the protective layer 14 and the surface of the absorber layer 16 to the wavelength of the inspection light is small, the contrast at the time of the inspection becomes poor, and an accurate inspection may not be done.

The absorber layer 16 in the present invention has a very low EUV light reflectivity and has an excellent property as an absorber layer for an EUV mask blank, but when viewed with respect to the wavelength of the inspection light, the light reflectivity may not be necessarily sufficiently low. As a result, the difference between the reflectivity at the surface of the absorber layer 16 and the reflectivity at the surface of the protective layer 14 at the wavelength of the inspection light tends to be small, and the contrast at the time of the inspection may not sufficiently be obtainable. If the contrast at the time of the inspection cannot be sufficiently obtained, a defect in a pattern cannot sufficiently be detected in the inspection of a mask, and an adequate inspection of a defect may not be carried out.

Therefore, like EUV mask blank 1' shown in FIG. 4, EUV mask blank 10' shown in FIG. 5 or EUV mask blank 20' shown in FIG. 6, by forming a low reflective layer 17 on the absorber layer 16, the contrast at the time of the inspection will be good. In other words, the light reflectivity at a wavelength of the inspection light becomes very low. When irradiated with light ray within the wavelength region of the inspection light, the low reflective layer 17 to be formed for such a purpose preferably has the maximum light reflectivity at the wavelength of the inspection light being at most 15%, more preferably at most 10%, further preferably at most 5%.

When the light reflectivity at the wavelength of the inspection light at the low reflective layer 17 is at most 15%, the contrast at the time of the inspection is good. Specifically, the contrast between reflected light with a wavelength of the inspection light at the surface of the protective layer 14 and reflected light with the wavelength of the inspection light at the surface of the low reflective layer 17 becomes at least 40%.

In this specification, the contrast can be obtained by using the following formula.

$$\text{Contrast } (\%) = ((R_2 - R_1)/(R_2 + R_1)) \times 100$$

Figure 7:
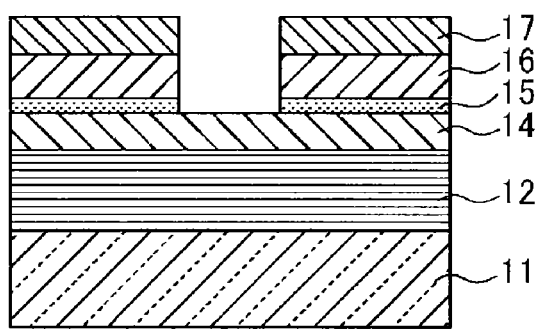
FIG. 7 shows a state wherein a pattern is formed in the absorber layer 16 (and the low reflective layer 17) of the EUV mask blank 1' in FIG. 4.

Here, at the wavelength of the inspection light, $R_2$ is the reflectivity at the surface of the protective layer 14, and $R_1$ is the reflectivity at the surface of the low reflective layer 17. Here, the above $R_1$ and $R_2$ are measured in such a state (i.e. in the state as shown in FIG. 7) wherein a pattern is formed in the Si thin film 15, the absorber layer 16 and the low reflective layer 17 of the EUV mask blank 1' shown in FIG. 4. The above $R_2$ is a value measured at the surface of the protective layer 14 exposed as the Si thin film, the absorber layer 16 and the low reflective layer 17 were removed by formation of a pattern, as shown in FIG. 7, and $R_1$ is a value measured at the surface of the low reflective layer 17 remained without being removed by the formation of the pattern.

In the present invention, the contrast represented by the above formula is more preferably at least 45%, further preferably at least 60%, particularly preferably at least 80%.

To attain the above-described properties, the low reflective layer 17 is preferably constituted by a material having a refractive index lower than the absorber layer 16 at the wavelength of the inspection light.

As a specific example of such a low reflective layer 17, a layer containing Ta and oxygen as the main components is preferred, and particularly, a layer containing TaON, TaBON or TaGeON as the main component may be exemplified. As another example, one containing Ta, B, Si and oxygen (O) in the following ratio (low reflective layer (TaBSiO)) may be mentioned.

Content of B: at least 1 at % and less than 5 at %, preferably from 1 to 4.5 at %, more preferably from 1.5 to 4 at %.
Content of Si: from 1 to 25 at %, preferably from 1 to 20 at %, more preferably from 2 to 10 at %.
Composition ratio (atomic ratio) of Ta to O (Ta:O): from 7:2 to 1:2, preferably from 7:2 to 1:1, more preferably from 2:1 to 1:1.

Further, as a specific example for the low reflective layer 17, one containing Ta, B, Si, O and N in the following ratio (low reflective layer (TaBSiON)) may be mentioned.

Content of B: at least 1 at % and less than 5 at %, preferably from 1 to 4.5 at %, more preferably from 2 to 4.0 at %.
Content of Si: from 1 to 25 at %, preferably from 1 to 20 at %, more preferably from 2 to 10 at %.
Composition ratio (atomic ratio) of Ta to O and N (Ta:(O+N)): from 7:2 to 1:2, preferably from 7:2 to 1:1, more preferably from 2:1 to 1:1.

Further, as another example for the low reflective layer 17, the material may be one containing at least Ta, O and H. And, a specific example containing at least Ta, O and H may be a TaOH film, a TaONH film containing Ta, O, N and H, a TaBONH film containing Ta, B, O, N and H, a TaBSiOH film containing Ta, B, Si, O and H, a TaBSiONH film containing Ta, B, Si, O, N and H, or a TaGeONH film containing Ta, Ge, O, N and H.

In the present invention, the low reflective layer 17 having the above construction i.e. a layer containing Ta and oxygen as the main components, is formed by using, as an underlayer, the absorber layer 16 wherein the proportion occupied by amorphous as a crystal state is higher than microcrystalline, whereby the low reflective layer 17 also tends to readily take a structure wherein the proportion occupied by amorphous as its crystal state is high, and be excellent in surface smoothness.

The surface roughness of the surface of the low reflective layer 17 is preferably at most 0.5 nm rms.

As mentioned above, in order to prevent deterioration in the dimensional stability of a pattern due to an influence of the edge roughness, the surface of the absorber layer 16 is required to be smooth. The low reflective layer 17 is formed on the absorber layer 16, and for the same reason, its surface is required to be smooth.

When the surface roughness of the surface of the low reflective layer 17 is at most 0.5 nm rms, the surface of the low reflective layer 17 is sufficiently smooth and free from deterioration in the dimensional precision of a pattern due to an influence of the edge roughness. The surface roughness of the surface of the low reflective layer 17 is more preferably at most 0.45 nm rms, further preferably at most 0.4 nm rms.

Further, in a case where the low reflective layer 17 is formed on the absorber layer 16, the total thickness of the absorber layer 16 and the low reflective layer 17 is preferably from 55 to 130 nm. Further, if the thickness of the low reflective layer 17 is more than the thickness of the absorber layer 16, the EUV absorbing property at the absorber layer 16 is likely to be low, and therefore, the thickness of the low reflective layer 17 is preferably less than the thickness of the absorber layer 16. For this purpose, the thickness of the low reflective layer 17 is preferably in a range of from 5 to 30 nm, more preferably in a range of from 10 to 20 nm.

In the present invention, the low reflective layer 17 may be formed by using a film forming method such as a sputtering method, such as a magnetron sputtering method or an ion beam sputtering method.

Here, the reason as to why it is preferred to form a low reflective layer 17 on the absorber layer 16 as in EUV mask blank 1' shown in FIG. 4, in EUV mask blank 10' shown in FIG. 5 or in EUV mask blank 20' shown in FIG. 6, is that the wavelength of the inspection light for a pattern is different from the wavelength of EUV light. Therefore, in a case where EUV light (in the vicinity of 13.5 nm) is used as the inspection light for a pattern, it is considered unnecessary to form a low reflective layer 17 on the absorber layer 16. The wavelength of the inspection light tends to shift toward a low wavelength side as the size of a pattern becomes small, and in future, it is considered to be shifted to 193 nm or further to 13.5 nm. In the case where the wavelength of the inspection light is 13.5 nm, it is considered unnecessary to form a low reflective layer 17 on the absorber layer 16.

The EUV mask blank to be produced by the process of the present invention may have a functional film known in the field of EUV mask blanks, in addition to the reflective layer 12, protective layer 14, Si thin film 15, absorber layer 16 and low reflective layer 17, and the intermediate layer 13 which may be optionally formed. A specific example of such a functional film may, for example, be an electrically conductive coating formed on the rear side of the substrate to promote the electrostatic chucking of the substrate, as disclosed in e.g. JP-A-2003-501823. Here, the rear side of the substrate means the surface on the opposite side to the side where the reflective layer 12 is formed, in the substrate 11 in FIG. 1. For the electrically conductive coating to be formed on the rear side of the substrate for such a purpose, the electrical conductivity and the thickness of the constituting material are selected so that the sheet resistance will be at most $100\Omega/\square$. The constituting material of the electrically conductive coating may be selected widely from those disclosed in known literatures. For example, an electrically conductive coating disclosed in JP-A-2003-501823, specifically a coating comprising silicon, TiN, molybdenum, chromium and TaSi may be applied. The thickness of the electrically conductive coating may, for example, be from 10 to 1,000 nm.

The electrically conductive coating may be formed by means of a known film-forming method, e.g. a sputtering method such as a magnetron sputtering method or an ion beam sputtering method, a CVD method, a vacuum vapor deposition method or an electroplating method.

A reflective mask for EUV lithography may be produced by patterning at least the absorber layer (in a case where a low reflective layer is formed on the absorber layer, the absorber layer and the low reflective layer) of the EUV mask blank to be produced by the process of the present invention. The method for patterning the absorber layer (in a case where a low reflective layer is formed on the absorber layer, the absorber layer and the low reflective layer), is not particularly limited. For example, a method may be employed wherein a resist is applied on the absorber layer (in a case where a low reflective layer is formed on the absorber layer, the absorber layer and the low reflective layer) to form a resist pattern, and by using it as a mask, the absorber layer (in a case where a low reflective layer is formed on the absorber layer, the absorber layer and the low reflective layer) is subjected to etching. The material for the resist, or the drawing method for the resist pattern may suitably be selected in consideration of e.g. the material of the absorber layer (in a case where a low reflective layer is formed on the absorber layer, the absorber layer and the low reflective layer). As the method for etching the absorber layer (in a case where a low reflective layer is formed on the absorber layer, the absorber layer and the low reflective layer), dry etching using a chlorine-type gas as the etching gas may be employed. After patterning the absorber layer (in a case where a low reflective layer is formed on the absorber layer, the absorber layer and the low reflective layer), the resist is removed by a remover liquid to obtain a reflective mask for EUV lithography (EUV mask). Further, during the patterning, the Si thin film present between the absorber layer and the protective layer is also removed.

A process for producing a semiconductor integrated circuit using the EUV mask obtainable by the above procedure will be described. This method may be applied to a process for producing a semiconductor integrated circuit by means of a photolithography method using EUV light as the light source for exposure. Specifically, a substrate such as a silicon wafer coated with a resist is disposed on a stage, and the above EUV mask is set on a reflective exposure apparatus combined with a reflective mirror. And, EUV light from a light source is applied to the EUV mask via the reflective mirror to have the EUV light reflected by the EUV mask and is applied to the substrate coated with the resist. By such a pattern transfer step, a circuit pattern is transferred to the substrate. The substrate having a circuit pattern transferred thereto is subjected to etching of sensitized or non-sensitized portions by development, followed by peeling of the resist. A semiconductor integrated circuit is produced by repeating such a process.

EXAMPLES

Now, the present invention will be described in further detail with reference to Examples. In each of the following Examples 1 and 2 and Comparative Example 1, the operation is carried out under such a condition that the composition ratio of Ta:N in the absorber layer becomes 7:3.

Example 1

In this Example, an EUV mask blank 10' as shown in FIG. 5 was prepared.

As a substrate 11 for film formation, a $SiO_2$—$TiO_2$ type glass substrate (size: 6 inches (152.4 mm) square, thickness: 6.3 mm) was used. The thermal expansion coefficient of this glass substrate was $0.05\times10^{-7}/°C.$, the Young's modulus was 67 GPa, the Poisson ratio was 0.17, and the specific rigidity was $3.07\times10^7$ m$^2$/s$^2$. This glass substrate was polished to form a smooth surface having a surface roughness rms of at most 0.15 nm and a planarity of at most 100 nm.

On the rear surface side of the substrate 11, a Cr film having a thickness of 100 nm was formed by a magnetron sputtering method to provide an electrically conductive coating (not shown in the drawings) having a sheet resistance of $100\Omega/\square$.

By using the formed Cr film, the substrate 11 (size: 6 inches (152.4 mm) square, thickness: 6.3 mm) was fixed to a usual electrostatic chuck of a flat plate shape, and on the surface of the substrate 11, a Mo layer and then a Si layer were alternately formed by means of an ion beam sputtering method for 50 cycles to form a Mo/Si multilayer reflective film (reflective layer 12) having a total thickness of 340 nm ((2.3 nm+4.5 nm)×50). Here, the uppermost layer of the multilayer reflective film is a Si layer.

The film forming conditions for the Mo layer and the Si layer are as follows.
(Film Forming Conditions for Mo Layer)
  Target: Mo target
  Sputtering gas: Ar gas (gas pressure: 0.02 Pa)
  Voltage: 700 V
  Film forming rate: 0.064 nm/sec
  Film thickness: 2.3 nm
(Film Forming Conditions for Si Layer)
  Target: Si target (boron-doped)
  Sputtering gas: Ar gas (gas pressure: 0.02 Pa)
  Voltage: 700 V
  Film forming rate: 0.077 nm/sec
  Film thickness: 4.5 nm Then, the surface of the Si layer as the uppermost layer of the Mo/Si multilayer reflective film was exposed to a nitrogen-containing atmosphere under the following conditions. Here, at the time of exposing the surface of the Si layer, no thermal treatment was carried out.
(Exposure Conditions)
  Atmosphere gas: Ar gas (carrier gas), flow rate: 17 sccm, nitrogen gas, flow rate: 50 sccm
  Nitrogen gas partial pressure: 0.2 mTorr ($2.6\times10^{-2}$ Pa)
  Atmosphere pressure: 0.3 mTorr ($3.5$ Torr$\times10^{-2}$ Pa)
  Exposure time: 600 sec Nitrogen partial pressure×exposure time: 1.2×10⁵ L (1 L (Langmuir)=1×10⁻⁶ Torr·s=1.33×10⁻⁴ Pa·s)

Then, a Ru layer as the protective layer 14 was formed by using an ion beam sputtering method. The conditions for forming the protective layer 14 are as follows.
Target: Ru target
Sputtering gas: Ar gas (gas pressure: 0.02 Pa)
Voltage: 700 V
Film forming rate: 0.052 nm/sec
Film thickness: 2.5 nm Then, a Si thin film 15 was formed by using an ion beam sputtering method. The conditions for forming the Si thin film are as follows.
(Film Forming Conditions for Si Thin Film)
Target: Si target (boron doped)
Sputtering gas: Ar gas (gas pressure: 0.02 Pa)
Voltage: 700 V
Film forming rate: 0.077 nm/sec
Film thickness: 0.5 nm And, after forming the Si thin film, it was exposed to the atmospheric air.

Then, on the Si thin film 15, a TaN layer was formed as an absorber layer 16 by means of a magnetron sputtering method.

The conditions for forming the TaN layer are as follows.
(Film Forming Conditions for TaN Layer)
Target: Ta target
Sputtering gas: mixed gas of Ar and $N_2$ (Ar: 86 vol %, $N_2$: 14 vol %, gas pressure: 0.3 Pa)
Applied power: 1,000 W
Film forming rate: 0.1 nm/sec
Film thickness: 63 nm Then, on the absorber layer 16, a TaON layer was formed as a low reflective layer 17 by means of a magnetron sputtering method, to obtain a mask blank 10' as shown in FIG. 5.

The conditions for forming the TaON film are as follows.
(Film Forming Conditions for TaON Layer)
Target: Ta target
Sputtering gas: mixed gas of Ar, $N_2$ and $O_2$ (Ar: 61 vol %, $N_2$: 12 vol %, $O_2$: 32 vol %, gas pressure: 0.3 Pa)
Applied power: 1,000 W
Film forming rate: 0.02 nm/sec
Film thickness: 7 nm With respect to the mask blank obtained by the above procedure, the following evaluations were carried out.
(1) Crystal State With respect to a sample formed up to the absorber layer (TaN layer) 16, the crystal state of the absorber layer 16 was confirmed by means of an X-Ray Diffractmeter (manufactured by RIGAKU CORPORATION). Among the obtained diffraction peaks, no sharp peak was observed.

Further, the composition of the absorber layer 16 was such that Ta was 68 at % and N was 32 at %.
(2) Surface Roughness The surface roughness of the low reflective layer (TaON layer) 17 was confirmed by means of an Atomic Force Microscope (No. SPI3800, manufactured by Seiko Instruments Inc.) in accordance with JIS-B0601 (1994). The surface roughness rms of the low reflective layer (TaON layer) 17 was 0.36 nm.

Example 2

Example 2 is carried out in the same manner as in Example 1 except that the condition is changed so that after forming the Mo/Si multilayer film (reflective layer 12), no exposure to the nitrogen atmosphere is carried out. That is, in this Example, EUV mask blank 1' shown in FIG. 4 is prepared.
(1) Crystal State With respect to a sample formed up to the absorber layer (TaN layer) 16, the crystal state of the absorber layer 16 is confirmed by means of an X-Ray Diffractmeter (manufactured by RIGAKU CORPORATION). Among the obtained diffraction peaks, no sharp peak is observed.

Further, the composition of the absorber layer 16 is such that Ta is 68 at % and N is 32 at %.
(2) Surface Roughness The surface roughness of the low reflective layer (TaON layer) 17 is confirmed by means of an Atomic Force Microscope (No. SPI3800, manufactured by Seiko Instruments Inc.) in accordance with JIS-B0601 (1994). The surface roughness rms of the low reflective layer (TaON layer) 17 becomes to be at most 0.34 nm.

Comparative Example 1

Comparative Example 1 was carried out in the same manner as in Example 2 except that without forming a Si thin film 15, the absorber layer (TaN layer) 16 was directly formed on the protective layer 14.

With respect to the mask blank obtained by the above procedure, the following evaluations were carried out.
(1) Crystal State With respect to a sample formed up to the absorber layer (TaN layer) 16, the crystal state of the absorber layer 16 was confirmed by means of an X-Ray Diffractmeter (manufactured by RIGAKU CORPORATION), whereby it was confirmed that among the obtained diffraction peaks, sharp peaks were observed.

Further, the composition of the absorber layer 16 was such that Ta was 72 at % and N was 28 at %.
(2) Surface Roughness The surface roughness of the low reflective layer (TaON layer) 17 was confirmed by means of an Atomic Force Microscope (No. SPI3800, manufactured by Seiko Instruments Inc.) in accordance with JIS-B0601 (1994). The surface roughness rms of the low reflective layer (TaON layer) 17 was 0.52 nm, and thus, the surface roughness was large as compared with the case where a Si thin film 15 was formed.

The entire disclosure of Japanese Patent Application No. 2012-284649 filed on Dec. 27, 2012 including specification, claims, drawings and summary is incorporated herein by reference in its entirety.

REFERENCE SYMBOLS 1, 1', 10, 10', 20, 20': EUV mask blank
11: Substrate
12: Reflective layer
13: Intermediate layer
14: Protective layer
15: Si thin film
16: Absorber layer
17: Low reflective layer
21: First layer
22: Second layer

What is claimed is:
1. A process for producing a reflective mask blank for EUV lithography (EUVL), which comprises forming a multilayer reflective film for reflecting EUV light on a film-forming surface of a substrate, then forming a protective layer for protecting the multilayer reflective film, on the multilayer reflective film, and forming an absorber layer for absorbing

EUV light, on the protective layer, to produce a reflective mask blank for EUVL, wherein
  the multilayer reflective film is a Mo/Si multilayer reflective film,
  the protective layer is a Ru layer or a Ru compound layer,
  the absorber layer is a layer containing at least Ta and N, and
  after forming the Mo/Si multilayer reflective film, the protective layer is formed, and after forming a Si thin film or Si oxide thin film having a thickness of at most 2 nm on the protective layer, the absorber layer is formed.

2. The process for producing a reflective mask blank for EUVL according to claim 1, wherein the absorber layer is one member selected from the group consisting of TaN, TaNH, TaBN, TaGaN, TaGeN, TaSiN, TaBSiN and PdTaN.

3. The process for producing a reflective mask blank for EUVL according to claim 1, wherein after forming the Mo/Si multilayer reflective film, the surface of a Si layer as the uppermost layer of the Mo/Si multilayer reflective film is exposed to a nitrogen-containing atmosphere without exposing it to the atmospheric air, and then, the protective layer is formed.

4. A reflective mask blank for EUV lithography obtained by the process for producing a reflective mask blank for EUVL as defined in claim 1.

5. A process for producing a reflective mask blank for EUV lithography (EUVL), which comprises forming a multilayer reflective film for reflecting EUV light on a film-forming surface of a substrate, then forming a protective layer for protecting the multilayer reflective film, on the multilayer reflective film, forming an absorber layer for absorbing EUV light, on the protective layer, and forming a low reflective layer to an inspection light to be used for inspection of a mask pattern, on the absorber layer, to produce a reflective mask blank for EUVL, wherein
  the multilayer reflective film is a Mo/Si multilayer reflective film,
  the protective layer is a Ru layer or a Ru compound layer,
  the absorber layer is a layer containing at least Ta and N,
  the low reflective layer is a layer containing at least Ta and O, and
  after forming the Mo/Si multilayer reflective film, the protective layer is formed, and after forming a Si thin film or Si oxide thin film having a thickness of at most 2 nm on the protective layer, the absorber layer is formed.

6. The process for producing a reflective mask blank for EUVL according to claim 5, wherein the absorber layer is one member selected from the group consisting of TaN, TaNH, TaBN, TaGaN, TaGeN, TaSiN, TaBSiN and PdTaN.

7. The process for producing a reflective mask blank for EUVL according to claim 5, wherein the low reflective layer is one member selected from the group consisting of TaON, TaBON, TaBSiO, TaBSiON, TaGeON, TaOH, TaONH, TaBONH, TaBSiOH, TaBSiONH and TaGeONH.

8. The process for producing a reflective mask blank for EUVL according to claim 5, wherein after forming the Mo/Si multilayer reflective film, the surface of a Si layer as the uppermost layer of the Mo/Si multilayer reflective film is exposed to a nitrogen-containing atmosphere without exposing it to the atmospheric air, and then, the protective layer is formed.

9. A reflective mask blank for EUV lithography obtained by the process for producing a reflective mask blank for EUVL as defined in claim 5.

10. A reflective mask blank for EUV lithography comprising a substrate, and a multilayer reflective film for reflecting EUV light, a protective layer for protecting the multilayer reflective film and an absorber layer for absorbing EUV light, formed in this order on the substrate, wherein
  the multilayer reflective film is a Mo/Si multilayer reflective film,
  the protective layer is a Ru layer or a Ru compound layer, which contains N,
  the absorber layer is a layer containing at least Ta and N, and
  a Si thin film or Si oxide thin film having a thickness of at most 2 nm is formed between the protective layer and the absorber layer.

11. The reflective mask blank for EUV lithography according to claim 10, wherein the absorber layer is one member selected from the group consisting of TaN, TaNH, TaBN, TaGaN, TaGeN, TaSiN, TaBSiN and PdTaN.

12. The reflective mask blank for EUV lithography according to claim 10, wherein the uppermost layer of the multilayer reflective film is a Si film, and an intermediate layer containing Si and N is formed between the uppermost layer of the multilayer reflective film and the protective layer.

13. The reflective mask blank for EUV lithography according to claim 12, wherein the intermediate layer is composed of a first layer and a second layer from the multilayer reflective film side,
  in the intermediate layer, the first layer contains from 0.5 to 25 at % of nitrogen and from 75 to 99.5 at % of Si, the second layer contains from 0.1 to 10 at % of nitrogen and from 0.1 to 30 at % of Si, and the total thickness of the first layer and the second layer is from 0.2 to 2.5 nm, and
  the protective layer contains substantially no Si.

14. The reflective mask blank for EUV lithography according to claim 10, wherein the thickness of the protective layer is from 1 to 10 nm.

15. A reflective mask for EUV lithography obtained by patterning the reflective mask blank for EUV lithography as defined in claim 10.

16. A reflective mask blank for EUV lithography comprising a substrate, and a multilayer reflective film for reflecting EUV light, a protective layer for protecting the multilayer reflective film, an absorber layer for absorbing EUV light and a low reflective layer to an inspection light to be used for inspection of a mask pattern, formed in this order on the substrate, wherein
  the multilayer reflective film is a Mo/Si multilayer reflective film,
  the protective layer is a Ru layer or a Ru compound layer, which contains N,
  the absorber layer is a layer containing at least Ta and N,
  the low reflective layer is a layer containing at least Ta and O, and
  a Si thin film or Si oxide thin film having a thickness of at most 2 nm is formed between the protective layer and the absorber layer.

17. The reflective mask blank for EUV lithography according to claim 16, wherein the absorber layer is one member selected from the group consisting of TaN, TaNH, TaBN, TaGaN, TaGeN, TaSiN, TaBSiN and PdTaN.

18. The reflective mask blank for EUV lithography according to claim 16, wherein the low reflective layer is one member selected from the group consisting of TaON, TaBON, TaBSiO, TaBSiON, TaGeON, TaOH, TaONH, TaBONH, TaBSiOH, TaBSiONH and TaGeONH.

19. The reflective mask blank for EUV lithography according to claim 16, wherein the uppermost layer of the multilayer reflective film is a Si film, and an intermediate layer containing Si and N is formed between the uppermost layer of the multilayer reflective film and the protective layer.

20. The reflective mask blank for EUV lithography according to claim 19, wherein the intermediate layer is composed of a first layer and a second layer from the multilayer reflective film side, in the intermediate layer, the first layer contains from 0.5 to 25 at % of nitrogen and from 75 to 99.5 at % of Si, the second layer contains from 0.1 to 10 at % of nitrogen and from 0.1 to 30 at % of Si, and the total thickness of the first layer and the second layer is from 0.2 to 2.5 nm, and the protective layer contains substantially no Si.

21. The reflective mask blank for EUV lithography according to claim 16, wherein the thickness of the protective layer is from 1 to 10 nm.

22. A reflective mask for EUV lithography obtained by patterning the reflective mask blank for EUV lithography as defined in claim 16.

* * * * *